United States Patent
Chang et al.

Patent Number: 6,159,842
Date of Patent: Dec. 12, 2000

[54] METHOD FOR FABRICATING A HYBRID LOW-DIELECTRIC-CONSTANT INTERMETAL DIELECTRIC (IMD) LAYER WITH IMPROVED RELIABILITY FOR MULTILEVEL INTERCONNECTIONS

[75] Inventors: Weng Chang; Yao-Yi Cheng, both of Taipei, Taiwan

[73] Assignee: Taiwan Semiconductor Manufacturing Company, Hsin-Chu, Taiwan

[21] Appl. No.: 09/229,382

[22] Filed: Jan. 11, 1999

[51] Int. Cl.[7] .......................... H01L 21/00; H01L 21/70; H01L 21/77

[52] U.S. Cl. .......................... 438/622; 438/623; 438/619; 438/702; 216/2

[58] Field of Search .......................... 438/622, 623, 438/626, 618, 631, 633, 675, 680, 619, 702; 216/2, 37, 68

[56] References Cited

U.S. PATENT DOCUMENTS

| | | | |
|---|---|---|---|
| 5,235,195 | 8/1993 | Tran et al. | 257/59 |
| 5,461,003 | 10/1995 | Havemann et al. | 437/187 |
| 5,472,913 | 12/1995 | Havemann et al. | 438/702 |
| 5,476,817 | 12/1995 | Numata | 437/195 |
| 5,510,293 | 4/1996 | Numata | 437/195 |
| 5,607,773 | 3/1997 | Ahlburn et al. | 428/427 |
| 5,668,398 | 9/1997 | Havemann et al. | 257/522 |
| 5,759,906 | 6/1998 | Lou | 438/623 |
| 5,801,092 | 9/1998 | Ayers | 438/623 |
| 5,937,324 | 8/1999 | Abercrombie et al. | 438/648 |
| 6,051,491 | 4/2000 | Ito | 438/619 |

*Primary Examiner*—Gregory Mills
*Assistant Examiner*—P. Hassanzadeh
*Attorney, Agent, or Firm*—George O. Saile; Stephen B. Ackerman

[57] ABSTRACT

A method for fabricating a hybrid low dielectric constant intermetal dielectric layer with improved reliability for multilevel electrical interconnections on integrated circuits is achieved. After forming metal lines for interconnecting the semiconductor devices, a protective insulating layer composed of a low-k fluorine-doped oxide (k=3.5) is deposited. A porous low-k spin-on dielectric layer (k less than 3) is formed in the gaps between the metal lines to further minimize the intralevel capacitance. A more dense low-k dielectric layer, such as FSG, is deposited on the porous layer to provide improved structural mechanical strength and over the metal lines to provide reduced intralevel capacitance. Via holes are etched in the FSG and are filled with metal plugs and the method can be repeated for additional metal levels to complete the multilevel interconnections on the integrated circuit.

26 Claims, 2 Drawing Sheets

METHOD FOR FABRICATING A HYBRID LOW-DIELECTRIC-CONSTANT INTERMETAL DIELECTRIC (IMD) LAYER WITH IMPROVED RELIABILITY FOR MULTILEVEL INTERCONNECTIONS

BACKGROUND OF THE INVENTION

(1) Field of the Invention

The present invention relates to a method for making integrated circuits on semiconductor substrates, and more particularly to a method for forming multilevel wiring on substrates using a hybrid low-k (low dielectric constant) intermetal dielectric (IMD) layer that reduces the RC time delays. The method is particularly useful when the minimum feature sizes are less than 0.25 micrometer (um) and the interconnect delays become greater than the field effect transistor (FET) gate delays.

(2) Description of the Prior Art

As the Ultra Large Scale Integration (ULSI) circuit density increases and device features sizes become less than 0.25 micrometers, increasing numbers of patterned metal levels are required with decreasing spacings between metal lines at each level to effectively wire up discrete semiconductor devices on the semiconductor chips. In the more conventional method the different levels of metal interconnections are separated by layers of insulating material. These interposed insulating layers have etched via holes which are used to connect one level of metal to the next. Typically, the insulating layer is a silicon oxide ($SiO_2$) having a dielectric constant k (relative to vacuum) of about 4.1 to 4.5.

However, as the device dimensions decrease and the packing density increases, it is necessary to reduce the spacing between the metal lines at each level of interconnections to effectively wire up the integrated circuits. Unfortunately, as the spacing decreases, the intra- (on the same metal level) and interlevel (between metal levels) capacitances increase between metal lines since the capacitance C is inversely proportional to the spacing d between the lines ($C = k e A/d$ where k is the dielectric coefficient, e is the vacuum permittivity, A is the area, and d is the spacing between lines). Therefore, it is desirable to minimize the dielectric constant k in the insulator (dielectric) between the conducting lines to reduce the RC time constant and thereby increase the performance of the circuit (frequency response) since the signal propagation time in the circuit is adversely affected by the RC delay time, where R is the resistance of the metal line, and C is the inter- and/or the intralevel capacitance mentioned above.

To achieve an insulating layer with a dielectric constant less than 3.0, relatively porous spin-on insulating films are commonly used, such as hydrogen silsesquioxane (a Si polymer) (HSQ) with a k of 2.7–3.0, and other spin-on insulators commonly referred to as aerogels, nanogels or nanofoams. However, these low-k insulators are usually very porous and therefore do not provide good structural support for integration. Further, absorbed moisture and other chemicals in the porous insulator can cause corrosion of the metal lines.

Several methods for forming planarized interconnections using low-dielectric-constant insulators have been described. For example, in U.S. Pat. Nos. 5,476,817 and 5,510,293 to Numata, a conformal thermoconductive insulating layer, such as AlN, is deposited over the metal lines. A low-dielectric constant, such as an organic spin-on glass (OSOG), is deposited between the metal lines to reduce capacitance. Then another thermoconductive insulating layer is deposited over the metal lines and the low-k material. Another method is described in U.S. Pat. No. 5,759,906 to Lou in which a low-k spin-on layer is used to reduce capacitance and a fluorine-doped $SiO_2$ is deposited to form protective sidewalls in via holes to prevent corrosion of the metal from the low-k spin-on layer. Ahlburn et al. in U.S. Pat. No. 5,607,773 form a conformal protective layer composed of $SiO_2$ over the metal lines and then a low-k HSQ layer is deposited by spin coating and is cured. The multilevel dielectric is then completed by depositing a CVD $SiO_2$ or fluorine-doped silicon glass by adding $CF_4$ during deposition. U.S. Pat. Nos. 5,668,398 and 5,461,003 to Havemann et al. describe a method for making multilevel interconnections with air gaps formed between the metal lines. The methods involve exposing a disposable material between metal lines to $O_2$ through a porous oxide. The volatilized disposable material is then removed through the porous oxide to form an air gap with a dielectric constant of about 1.

Therefore there is still a need in the semi-conductor industry to provide an improved hybrid low-k intermetal dielectric that minimizes inter- and intralevel capacitance to reduce the RC time constant while providing a more reliable and manufacturable process.

SUMMARY OF THE INVENTION

A principal object of the present invention is to provide a hybrid low-k intermetal dielectric (IMD) layer that minimizes the RC delay time while improving the reliability of the low-k IMD layer.

It is another object of this invention to use two low-k insulating layers. A first low-k porous material is used as an intrametal dielectric layer to minimize the RC delay time, while a second less porous low-k material, such as a fluorine-doped silicon glass (FSG), is used over the metal lines as an intermetal dielectric (IMD) layer.

In accordance with the objects of this invention, a new method is achieved for fabricating a hybrid low-dielectric constant IMD layer on a semiconductor substrate having semiconductor devices and an overlying insulating layer. A conductive layer is deposited on the insulating layer. The conductive layer is patterned to form a first level of interconnecting lines to the devices on the substrate. The conductive layer is typically a metal, such as aluminum/copper (AlCu). A conformal insulating layer, such as silicon oxide ($SiO_2$), and more specifically a low-k silicate material composed of fluorine-doped silicon glass (FSG) having a dielectric constant of about 3.5, is deposited to protect the patterned conductive layer. Next, a porous first low-k material, and having an even lower dielectric constant (k), for example, less than 3.0, is deposited between the interconnecting metal lines, but not over the metal lines. The porous low-k layer, such as hydrogen silsesquioxane (HSQ) having a dielectric constant k (about 3), provides an insulating layer that minimizes the intralevel capacitance. A denser second low-k material, for example composed of fluorine-doped silicon glass (FSG), is deposited over the electrical interconnecting lines and over the porous first low-k material to form a cap layer that protects the porous first low-k material and concurrently to minimize interlevel capacitance. This completes the hybrid low-dielectric constant intermetal dielectric (IMD) layer for the first level of metal interconnections. Next, additional levels of hybrid low-k IMD layers can be formed by etching via holes in the second low-k layer and the insulating layer to the first level of interconnecting metal lines and forming metal plugs. The above method is then repeated for each additional level of metal interconnections necessary for wiring up the integrated circuit.

BRIEF DESCRIPTION OF THE DRAWINGS

The objectives and other advantages of this invention are best understood with reference to the preferred embodiment and drawings.

DESCRIPTION OF THE PREFERRED EMBODIMENT

The present invention relates to a method for fabricating a low-dielectric constant hybrid structure using a porous low-k dielectric material as an intrametal insulator and a more dense low-k dielectric material as a protective cap layer and as an intermetal insulator. A dense conformal insulating layer, which is an undoped $SiO_2$ or a low-k dielectric material, is used to protect the underlying metal interconnections from contamination.

Figure 1:
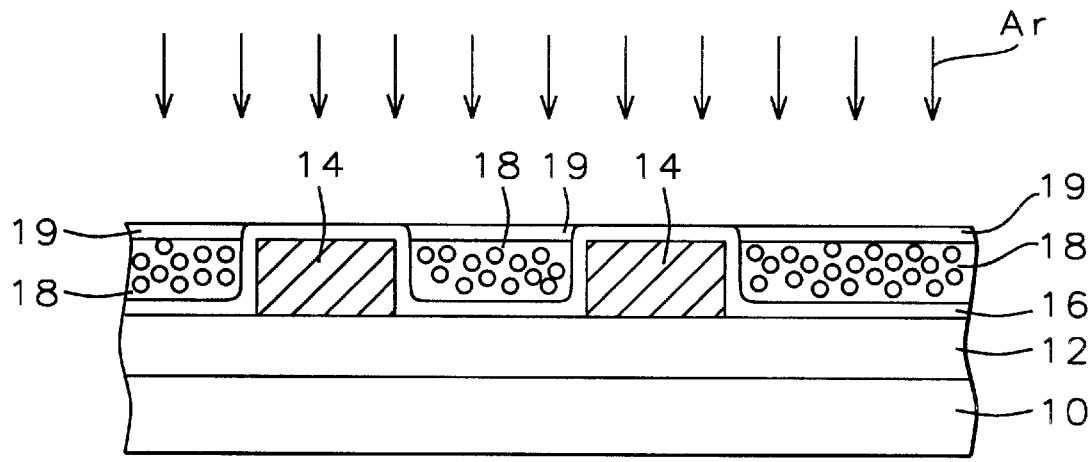
FIGS. 1 through 3 are schematic cross-sectional views showing the sequence of process steps for making a low-dielectric constant (k) hybrid intermetal dielectric (IMD) structure for multilevel metal interconnections on integrated circuits.

Referring now to FIG. 1, the method begins by depositing an insulating layer 12 on a semiconductor substrate 10 over semiconductor devices (not explicitly shown) to electrically insulate the devices from the first level of interconnections. The substrate 10 is typically a single-crystal silicon, and the most commonly used devices are field effect transistors (FETs). However, it should be understood by those skilled in the art that the invention also applies to other types of substrates and other types of devices, such as bipolar transistors and the like. The insulating layer 12 is typically a $SiO_2$ or a borophospho-silicate glass (BPSG) and is deposited by low pressure chemical vapor deposition (LPCVD) using a reactant gas such as tetraethosiloxane (TEOS). Typically the insulating layer 12 is planarized, for example by chemical/mechanical polishing (CMP), to a thickness of between about 4000 and 12000 Angstroms over the devices. Contact openings are etched by conventional photolithographic techniques to the devices on the substrate, and are not shown in the Figures to simplify the drawings and description since they are not relevant to the invention. An electrically conductive layer 14 is deposited and patterned to form a first level of electrical interconnections. Typically the conductive layer 14 is an aluminum/copper (AlCu) alloy having a barrier layer, such as titanium (Ti) or titanium nitride (TiN), to prevent Al spiking into the shallow diffused junctions of the devices on the substrate and thereby preventing device degradation. Alternatively, metal plugs, such as tungsten plugs, can be formed in the contact openings to provide electrical contacts to the devices on the substrate 10. Preferably the barrier layer (not shown separately) for layer 14 is deposited by physical vapor deposition (PVD), such as by sputtering from a Ti target, and the TiN layer can be formed sequentially in the deposition tool by introducing nitrogen as the reactant gas. The Ti/TiN is deposited to a total thickness of between about 100 and 2000 Angstroms. Then the AlCu for layer 14 is deposited also by PVD, such as by sputter deposition from an AlCu sputtering target. The AlCu conductive layer is deposited to a thickness of between about 2000 and 10000 Angstroms.

The first conductive layer 14 is then patterned by conventional photolithographic techniques and anisotropic plasma etching to form the interconnecting metal lines 14 for the devices. Typically for patterning AlCu layers, the anisotropic plasma etching can be carried out in a reactive ion etcher (RIE) using a reactant gas containing chlorine ($Cl_2$) and a carrier gas such as argon (Ar).

Still referring to FIG. 1, a dense conformal insulating layer 16 is deposited over the metal interconnections 14 to protect the interconnections when a more porous low-k material is later used to reduce the capacitance and hence the RC time constant between metal lines. Layer 16 is preferably a silicon oxide ($SiO_2$), and more specifically a low-k silicate material composed of fluorine-doped silicon glass (FSG) having a dielectric constant of about 3.5. The FSG layer 16 is deposited by plasma-enhanced CVD or by high-density-plasma CVD (HDP-CVD) to a thickness of between about 300 and 2000 Angstroms. This higher density oxide protects the metal inter-connections from moisture and chemical attack when a more porous and a lower-k spin-on material is later used to further reduce the RC time constant. This conformal FSG insulating layer 16 also further reduces the capacitance compared to a more conventional undoped $SiO_2$ having a dielectric constant of about 4.5.

Continuing with FIG. 1, a porous first low-k material layer 18 is deposited to fill the gaps between the metal interconnecting lines 14 and over the conformal insulating layer 16. Preferably layer 18 is a porous ultra-low-k spin-on insulator, such as hydrogen silsesquioxane (HSQ) having a dielectric constant k of about 3, which is lower than the protective FSG layer 16. One type of low-k spin-on dielectric is a porous FOX™ manufactured by Dow Corning of U.S.A. (FOX™ is a porous oxide material, and is not to be confused with the acronym FOX commonly used for Field OXide.) The low-dielectric layer 18 is spin coated to a thickness sufficient to fill the gaps between the metal lines and is then cured by rapid thermal processing (RTP) or by using a hot plate as commonly practiced in the industry. Layer 18 is then etched back or chemically/mechanically polished back to the conformal insulating layer 16 on the metal lines 14 to form a porous low-k insulator that is essentially coplanar with the top surface of the metal lines 14. This provides an insulation 18 between metal lines that minimizes the intralevel capacitance. The low-k insulator 18 is plasma treated, for example, with argon or nitrogen to densify the top surface 19 of layer 18, as indicated by the vertical arrows, labeled Ar, in FIG. 1. The plasma treatment can be achieved in any plasma processing tool, such as in a reactive ion etcher, high-density plasma etcher, barrel plasma asher, and the like other. The plasma treatment is carried out using processing parameters (such as pressure, time, and power) appropriate for the plasma tool used to densify the top surface 19 of layer 18.

Figure 2:
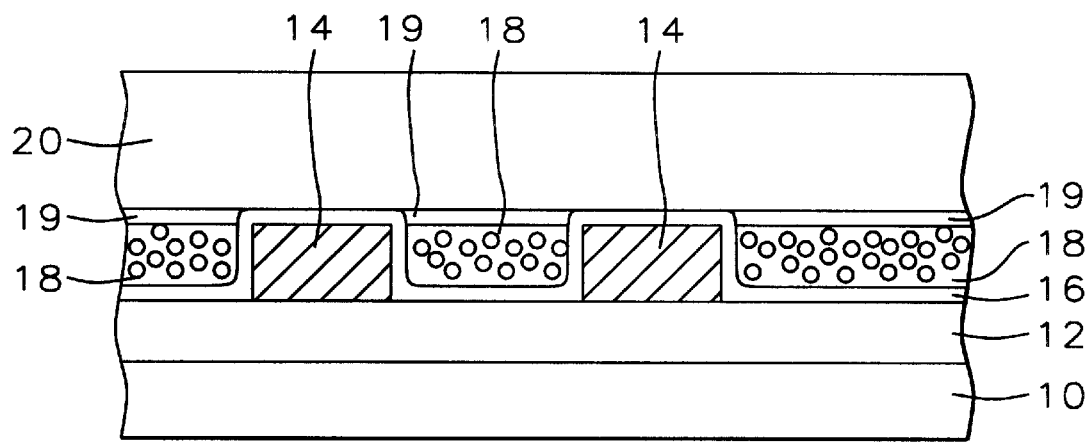

Referring to FIG. 2, a denser second low-k dielectric layer 20 is deposited over the porous first low-k material 18 to form a cap layer that protects the porous first low-k layer 18 from damage during processing. Layer 20 is also deposited over the electrical interconnecting lines 14 to provide an intermetal dielectric layer for the next level of electrical interconnections. Preferably the second low-k dielectric layer 20 is composed of a fluorine-doped silicon glass (FSG), deposited by PECVD using a reactant gas mixture such as silane ($SiH_4$), silicon tetrafluoride ($SiF_4$), and oxygen ($O_2$). Layer 20 is deposited to a preferred thickness of between about 3000 and 30000 Angstroms. The FSG layer 20 has a dielectric constant k of about 3.5 and minimizes the interlevel capacitance between different metal levels of the integrated circuit.

Figure 3:
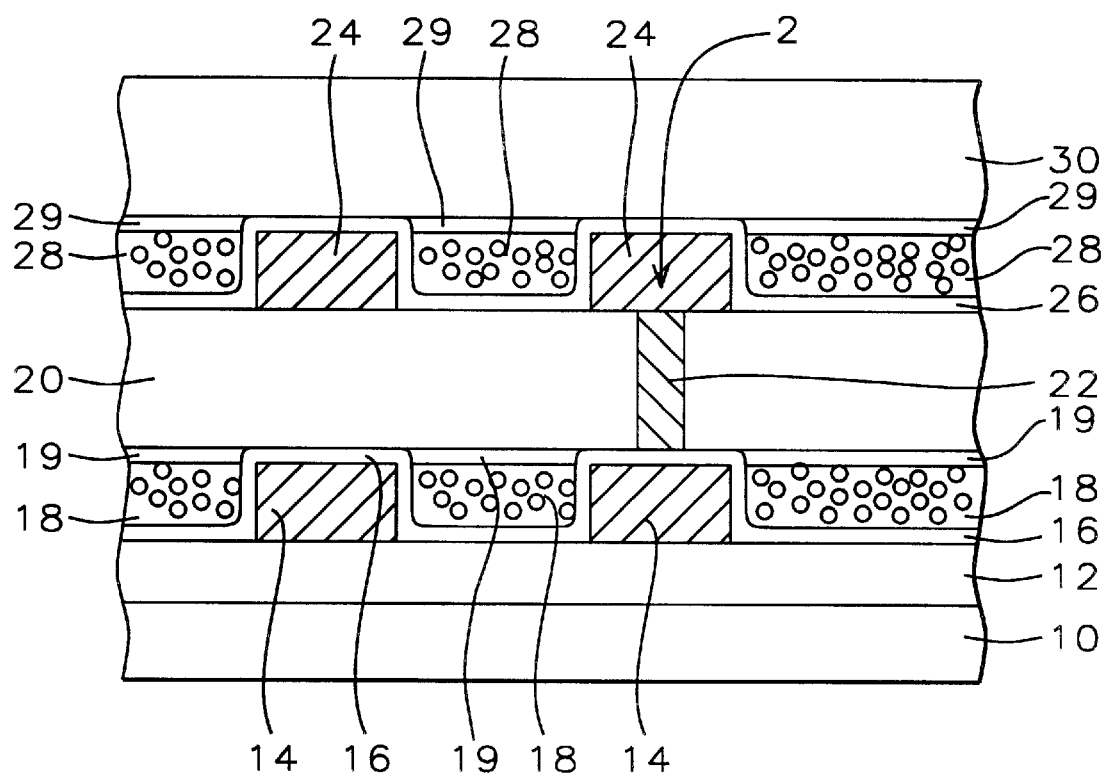

Referring now to FIG. 3, via holes 2 are etched in the second low-k layer 20 and the conformal insulating layer 16 to the first level metal lines 14 to provide contacts to the next level of interconnections. A metal, such as tungsten, is deposited to fill the via holes 2 and is etched back or polished back to form metal plugs 22. And as shown in FIG. 3, the process for making this novel hybrid low-dielectric constant intermetal dielectric (IMD) layer can be repeated for each additional level of metal interconnections necessary for wiring up the integrated circuit. For example, the next level of metal interconnections is formed by depositing and patterning a second metal layer 24. A protective low-k layer 26 is deposited and a porous spin-on low-k layer 28 is deposited, which is polished back and plasma treated with Ar to densify the top surface 29 of layer 28. A denser low-k cap layer 30 is then deposited to complete the second level of interconnections.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a hybrid low-dielectric constant (low-k) intermetal dielectric (IMD) layer for multilevel metal interconnections comprising the steps of:

providing a semiconductor substrate having semiconductor devices and an insulating layer thereon;

depositing a conductive layer on said insulating layer;

patterning said conductive layer to form electrical interconnecting lines to contact said devices;

depositing a conformal insulating layer as a protective layer over said patterned conductive layer;

depositing a porous first low-k material over said insulating layer to provide a material with minimum dielectric constant between said interconnecting lines;

etching back said porous first low-k material to said conformal insulating layer on said interconnecting lines, and leaving portions of said porous first low-k material in spaces between said interconnecting lines to minimize intralevel capacitance;

plasma treating said porous first low-k material to densify the surface;

depositing a denser second low-k material over said electrical interconnecting lines and said porous first low-k material to form a cap layer that protects said porous first low-k material and to minimize interlevel capacitance and to complete said hybrid low-dielectric constant intermetal dielectric (IMD) layer for said multilevel metal interconnections.

2. The method of claim 1, wherein said conductive layer is aluminum/copper alloy having a titanium/titanium nitride barrier layer on upper and lower surfaces.

3. The method of claim 2, wherein said aluminum/copper alloy is deposited to a thickness of between about 3000 and 10000 Angstroms.

4. The method of claim 1, wherein said conformal insulating layer is a fluorine-doped silicon glass (FSG) deposited by plasma-enhanced chemical vapor deposition, and is deposited to a thickness of between about 300 and 2000 Angstroms.

5. The method of claim 1, wherein said conformal insulating layer is silicon oxide deposited by plasma-enhanced chemical vapor deposition, and is deposited to a thickness of between about 200 and 2000 Angstroms.

6. The method of claim 1, wherein said porous first low-k material is a spin-on dielectric composed of hydrogen silsesquioxane (HSQ).

7. The method of claim 6, wherein said hydrogen silsesquioxane is cured by rapid thermal anneal (RTA) at a temperature of between about 350 and 500° C. for a time of between about 0.5 and 30 minutes.

8. The method of claim 1, wherein said denser second low-k material is a fluorine-doped silicon glass (FSG) and is deposited to a thickness of between about 3000 and 30000 Angstroms.

9. The method of claim 1, wherein said plasma treatment is carried out in an argon plasma.

10. A method for fabricating a hybrid low-dielectric constant (low-k) intermetal dielectric (IMD) layer for multilevel metal interconnections comprising the steps of:

providing a semiconductor substrate having semiconductor devices and an insulating layer thereon;

depositing a conductive layer on said insulating layer;

patterning said conductive layer to form electrical interconnecting lines to contact said devices;

depositing a conformal insulating layer composed of fluorine-doped silicon glass (FSG) to form a protective layer over said patterned conductive layer;

depositing a porous first low-k material composed of hydrogen silsesquioxane (HSQ) over said insulating layer to provide a material with minimum dielectric constant between said interconnecting lines;

etching back said porous first low-k material to said conformal insulating layer on said interconnecting lines, and leaving portions of said porous first low-k material in spaces between said interconnecting lines to minimize intralevel capacitance;

plasma treating said porous first low-k material to densify the surface;

depositing a denser second low-k material composed of fluorine-doped silicon glass (FSG) over said electrical interconnecting lines and said porous first low-k material to form a cap layer that protects said porous first low-k material and to minimize interlevel capacitance and to complete said hybrid low-dielectric constant intermetal dielectric (IMD) layer for said multilevel metal interconnections.

11. The method of claim 10, wherein said conductive layer is aluminum/copper alloy having a titanium/titanium nitride barrier layer on upper and lower surfaces.

12. The method of claim 11, wherein said aluminum/copper alloy is deposited to a thickness of between about 3000 and 10000 Angstroms.

13. The method of claim 10, wherein said conformal insulating layer is deposited by plasma-enhanced chemical vapor deposition to a thickness of between about 200 and 2000 Angstroms.

14. The method of claim 10, wherein said hydrogen silsesquioxane is cured by rapid thermal anneal (RTA) at a temperature of between about 350 and 500° C. for a time of between about 0.5 and 30 minutes.

15. The method of claim 10, wherein said denser second low-k material is deposited to a thickness of between about 3000 and 30000 Angstroms.

16. The method of claim 10, wherein said plasma treatment is carried out in an argon plasma.

17. A method for fabricating a hybrid low-dielectric constant (low-k) intermetal dielectric (IMD) layer for multilevel metal interconnections comprising the steps of:

a) providing a semiconductor substrate having semiconductor devices and an insulating layer thereon;

b) depositing a conductive layer on said insulating layer;

c) patterning said conductive layer to form electrical interconnecting lines to contact said devices;

d) depositing a conformal insulating layer as a protective layer over said patterned conductive layer;

e) depositing a porous first low-k material over said insulating layer to provide a material with minimum dielectric constant between said interconnecting lines;

f) etching back said porous first low-k material to said conformal insulating layer on said interconnecting lines, and leaving portions of said porous first low-k material in spaces between said interconnecting lines to minimize intralevel capacitance;

g) plasma treating said porous first low-k material to densify the surface;

h) depositing a denser second low-k material over said electrical interconnecting lines and said porous first low-k material to form a cap layer that protects said porous first low-k material and to minimize interlevel capacitance;

i) forming contact holes in said second low-k material to said electrical interconnecting lines and forming metal plugs in said contact holes;

j) performing steps b) through i) n times, wherein n is the number of metal levels necessary to complete said multilevel metal interconnections having said hybrid low-dielectric constant intermetal dielectric (IMD) layer.

18. The method of claim 17, wherein said conductive layer is aluminum/copper alloy having a titanium/titanium nitride barrier layer on upper and lower surfaces.

19. The method of claim 18, wherein said aluminum/copper alloy is deposited to a thickness of between about 3000 and 10000 Angstroms.

20. The method of claim 17, wherein said conformal insulating layer is a fluorine-doped silicon glass (FSG) deposited by plasma-enhanced chemical vapor deposition, and is deposited to a thickness of between about 300 and 2000 Angstroms.

21. The method of claim 17, wherein said conformal insulating layer is silicon oxide deposited by plasma-enhanced chemical vapor deposition, and is deposited to a thickness of between about 200 and 2000 Angstroms.

22. The method of claim 17, wherein said porous first low-k material is a spin-on dielectric composed of hydrogen silsesquioxane (HSQ).

23. The method of claim 22, wherein said hydrogen silsesquioxane is cured by rapid thermal anneal (RTA) at a temperature of between about 350 and 500° C. for a time of between about 0.5 and 30 minutes.

24. The method of claim 17, wherein said denser second low-k material is a fluorine-doped silicon glass (FSG) and is deposited to a thickness of between about 3000 and 30000 Angstroms.

25. The method of claim 17, wherein said metal plugs are tungsten.

26. The method of claim 17, wherein said plasma treatment is carried out in an argon plasma.

* * * * *